(12) United States Patent
Uenoyama et al.

(10) Patent No.: US 7,807,066 B2
(45) Date of Patent: Oct. 5, 2010

(54) METHOD OF MANUFACTURING A POROUS RESIN SUBSTRATE HAVING PERFORATIONS AND METHOD OF MAKING A POROUS RESIN SUBSTRATE INCLUDING PERFORATIONS HAVING ELECTRICALLY CONDUCTIVE WALL FACES

(75) Inventors: Mayo Uenoyama, Osaka (JP); Yasuhiro Okuda, Osaka (JP); Fumihiro Hayashi, Osaka (JP); Taro Fujita, Osaka (JP); Yasuhito Masuda, Osaka (JP); Yuichi Idomoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 709 days.

(21) Appl. No.: 11/660,993

(22) PCT Filed: Jul. 11, 2005

(86) PCT No.: PCT/JP2005/012768

§ 371 (c)(1),
(2), (4) Date: Feb. 23, 2007

(87) PCT Pub. No.: WO2006/022083

PCT Pub. Date: Feb. 3, 2006

(65) Prior Publication Data

US 2008/0006605 A1 Jan. 10, 2008

(30) Foreign Application Priority Data

Aug. 23, 2004 (JP) ............................. 2004-241756

(51) Int. Cl.
*B31D 3/00* (2006.01)
(52) U.S. Cl. ............................ 216/56; 216/87; 216/91; 216/94; 216/95

(58) Field of Classification Search .................. 216/56, 216/87, 91, 94, 95
See application file for complete search history.

(56) References Cited

U.S. PATENT DOCUMENTS

| 4,820,548 A | * | 4/1989 | Courduvelis et al. | ........ 427/98.7 |
| 5,449,427 A | | 9/1995 | Wojnarowski et al. | |
| 5,833,759 A | * | 11/1998 | Haslow et al. | ............... 134/1.3 |
| 2003/0168254 A1 | * | 9/2003 | Kariya et al. | ............... 174/261 |

FOREIGN PATENT DOCUMENTS

| JP | 63-58708 | 3/1988 |
| JP | 02-049385 | 2/1990 |

(Continued)

*Primary Examiner*—Binh X Tran
(74) *Attorney, Agent, or Firm*—McDermott Will & Emery LLP

(57) ABSTRACT

A method of manufacturing a perforated porous resin substrate, the method including the following steps: Step 1 of forming at least one perforation penetrating in the thickness direction from a first surface to a second surface in a porous resin substrate made of a resin material containing a fluoropolymer; Step 2 of etching treatment conducted by putting an etchant containing an alkali metal in contact with the wall face of each perforation; and Step 3 of putting an oxidizable compound or a solution thereof in contact with a degenerative layer generated by the etching treatment, and thereby removing the degenerative layer. A method of manufacturing a porous resin substrate in which electrical conductivity is afforded to the wall face of the perforation.

12 Claims, 4 Drawing Sheets

FOREIGN PATENT DOCUMENTS

| | | |
|---|---|---|
| JP | 05-237141 | 9/1993 |
| JP | 09-501802 | 2/1997 |
| JP | 09-320667 | 12/1997 |
| JP | 2000-504494 | 4/2000 |
| JP | 2003-22849 | 1/2003 |
| JP | 2003-059611 | 2/2003 |
| WO | WO 95/32604 | 11/1995 |
| WO | WO 98/20539 | 5/1998 |

\* cited by examiner

METHOD OF MANUFACTURING A POROUS RESIN SUBSTRATE HAVING PERFORATIONS AND METHOD OF MAKING A POROUS RESIN SUBSTRATE INCLUDING PERFORATIONS HAVING ELECTRICALLY CONDUCTIVE WALL FACES

RELATED APPLICATIONS

This application is a national phase of PCT/JP2005/012768 filed Jul. 11, 2005, which claims priority from Japanese /Application No. 2004-241756 filed Aug. 23, 2004, the disclosures of which Applications are incorporated by reference herein. The benefit of the filling and priority dates of the international and Japanese Applications is respectfully requested.

TECHNICAL FIELD

The present invention relates to methods of manufacturing perforated porous resin substrates, and more specifically, to a method of making a porous resin substrate made of a resin material containing a fluoropolymer, wherein the porous resin substrate has perforations penetrating in a thickness direction, the perforations being formed without compromising porous structure. Also, the present invention relates to a method of manufacturing a porous resin substrate in which the wall face of perforations are selectively afforded electrical conductivity.

BACKGROUND ART

In recent years, in accordance with the requirements of higher frequency and higher speed in the electronics field, the achievement of particularly low dielectric constant has been strongly demanded as the material characteristics of a resin substrate. Thus, porous resin materials have attracted much attention as resin substrate materials because of their low dielectric constant property, which is superior as compared with ordinary nonporous resin substrate materials.

In the past, proposals have been made with respect to the circuit connection materials and anisotropic conductive materials in which resin substrates are used. For example, an anisotropic conductive sheet is known in which electrical conductivity is afforded only to specific parts in a thickness direction by filling a conductive material in a number of through holes formed in the sheet made of a high polymer material. More specifically, a proposed anisotropic conductive sheet is formed in the following manner: a plurality of through holes are provided in an insulative stiff frame board made of a composite resin material which is reinforced with a resin material or glass fibers; and electrically conductive path elements are formed by filling the through holes with an insulating elastic macromolecular substance in which electro-conductive particles are dispersed. (Patent document 1)

Also proposed is an electrical connection member in which a metal is filled in a number of through holes formed in an electrically insulative macromolecular film such that electrical conductivity is afforded only in a thickness direction of the film (Patent document 2). Further, proposed is an elastic connector in which conductive members are arranged in a plurality of small holes formed in the thickness direction in an elastic sheet processed with foaming treatment (Patent document 3).

Generally, methods for providing perforations in a substrate are, for examples, machining methods such as punching by a punch and die, perforation by a mold, and drilling by a drill. Also known is a laser ablation method in which a laser is irradiated for perforation.

However, it is very difficult to apply the above-mentioned perforation methods to a porous resin material. In order to use the porous resin material as a substrate material, it is necessary to form a perforation which is greater than a pore diameter of the porous resin material. However, when a porous resin material formed in the shape of a substrate (hereinafter referred to as the "porous resin substrate") is perforated by machining or laser processing, the porous structure of the wall face of a perforation tends to be destroyed to be nonporous. If the porous structure of the wall face of a perforation in the porous resin substrate is destroyed, the characteristics thereof as the porous resin material is impaired. The porous resin substrate has resilience in the thickness direction; however, when the porous structure of the wall face of a perforation is destroyed, the perforated part will be crushed and accordingly the resilience will be lost once a compressive load is applied in the thickness direction.

Moreover, even if a porous resin substrate is perforated, it will be very difficult to afford electrical conductivity by adhering metal selectively only to the wall face of the perforation in the secondary processing. Thus, it is difficult to accomplish a precise perforation of the porous resin substrate, and it is also difficult to perform the secondary processing after perforation.

A method proposed in the past for forming a via in a substrate includes the following process: at least one via is formed in the substrate by laser perforation, and subsequently, the cut-away substances generated as a result of the laser perforation are removed by a sodium etching treatment (Patent document 4). In Patent document 4, a porous organic substrate material which includes a fluoropolymer matrix is shown as the substrate. Patent document 4 teaches that the roughly cut-away substances which have re-adhered to the wall of the via during the laser perforation should be removed prior to the subsequent process of plating for metallic deposition. Patent document 4 discloses, as the porous organic substrate material which constitutes a substrate, a porous matrix system containing expanded polytetrafluoroethylene in which a mixture comprising a thermosetting or thermoplastic resin, an adhesive resin, and a filler is imbibed or impregnated.

[Patent document 1] Japanese Patent Application Publication No. H9-320667

[Patent document 2] Japanese Patent Application Publication No. H2-49385

[Patent document 3] Japanese Patent Application Publication No. 2003-22849

[Patent document 4] WO 98/20539

When a perforation is made in a porous resin material by laser processing, the porous structure of the wall face of the perforation tends to be destroyed, resulting in a nonporous structure. Likewise, when a perforation is made in a porous resin material by machining such as drilling or punching, the wall face of the perforation tends to become nonporous. If cut-away substances generated by laser processing for perforation remain, they can be removed by subjecting the wall face of the perforation to sodium etching.

However, if a fluoropolymer such as polytetrafluoroethylene (PTFE) is subjected to sodium etching treatment, the characteristics of PTFE will be compromised because a degenerative layer is thereby formed. Since the porous resin material formed from a resin material containing a fluoropolymer such as expanded porous PTFE has a micro-porous structure, it tends to suffer from the adverse effect of the degeneration due to the sodium etching treatment.

Particularly, an extremely difficult problem to be solved was how to make porous the part of the perforation wall face which has been made nonporous, in addition to maintaining the entire porous structure, when a perforation is formed by machining or laser processing in a porous resin material made of a resin containing a fluoropolymer. If the porous structure of the wall face of a perforation is left as destroyed, the characteristics thereof such as resilience will be hampered, and also it will not be possible to form a part having a sufficient electrical conductivity even if plating treatment is performed on the wall face of the perforation.

DISCLOSURE OF THE INVENTION

Problem to be Solved by the Invention

Therefore, an object of the present invention is to provide a method of manufacturing a porous resin substrate made of a resin material containing a fluoropolymer, in which a perforation is formed by machining or laser processing such that in addition to the porous structure of the entire porous resin substrate being maintained, the wall face of the perforation which has been made nonporous is made porous.

Another object of the present invention is to provide a method of manufacturing a porous resin substrate in which the wall face of a perforation having such porous structure is selectively afforded electrical conductivity.

In order to achieve such objects, the present inventors conducted extensive studies, and consequently have found that it is possible to maintain the porous structure of an entire porous resin substrate made of a resin material containing a fluoropolymer and that the porous structure of a wall face part of a perforation which has been made nonporous can be made porous, if at least one perforation is formed penetrating in a thickness direction in the porous resin substrate and subsequently etching treatment using an etchant which contains an alkali metal is performed, followed by treatment with a compound capable of oxidization or a solution containing the compound.

According to the method of the present invention, by making the etchant containing an alkali metal to contact the wall face of a perforation formed in a porous resin substrate so that the part which have been made nonporous can be changed in quality by etch processing, and next the part where the quality has been changed by the etching treatment can be removed by the oxidation decomposition processing with an oxidizable compound or the solution thereof. The fact that an etch treated layer is removed by the oxidation decomposition can easily be judged because the layer which has been etch treated and changed in quality to have a brown color recover its original color tone and because the porous structure appears.

When an etch treated layer (degenerative layer) is removed, the part which have been made nonporous as a result of perforation process is removed, and hence the porous structure of the entire porous resin substrate including the wall face of a perforation can be maintained. Thus, since the wall face of the perforation has a porous structure, it is easy to provide it with a plating catalyst and to afford it electrical conductivity by electroless plating. The present invention has been completed based on such knowledge.

Means for Solving the Problem to be Solved

The present invention provides a method of manufacturing a perforated porous resin substrate, the method including the following steps 1 to 3:

(1) Step 1 of forming at least one perforation penetrating in the thickness direction from a first surface to a second surface in a porous resin substrate made of a resin material containing a fluoropolymer;

(2) Step 2 of etching treatment conducted by putting an etchant containing an alkali metal in contact with the wall face of each perforation; and (3) Step 3 of putting an oxidizable compound or a solution thereof in contact with a degenerative layer generated by the etching treatment, and thereby removing the degenerative layer.

Also, the present invention provides a method of manufacturing a porous resin substrate in which the wall face of a perforation is afforded electrical conductivity, the method including the following Steps 1 to 5:

(1) Step 1 of forming at least one perforation penetrating in the thickness direction from a first surface to a second surface in a porous resin substrate made of a resin material containing a fluoropolymer;

(2) Step 2 of etching treatment conducted by putting an etchant containing an alkali metal in contact with the wall face of each perforation; and (3) Step 3 of putting an oxidizable compound or the solution thereof in contact with a degenerative layer generated by the etching treatment, and thereby removing the degenerative layer;

(4) Step 4 of adhering a catalyst for facilitating the reduction reaction of a metal ion to the wall face of each perforation; and (5) Step 5 of adhering a conductive metal to the wall face of each perforation by means of the catalyst.

EXPLANATION OF REFERENCED NUMERALS

Figure 1:
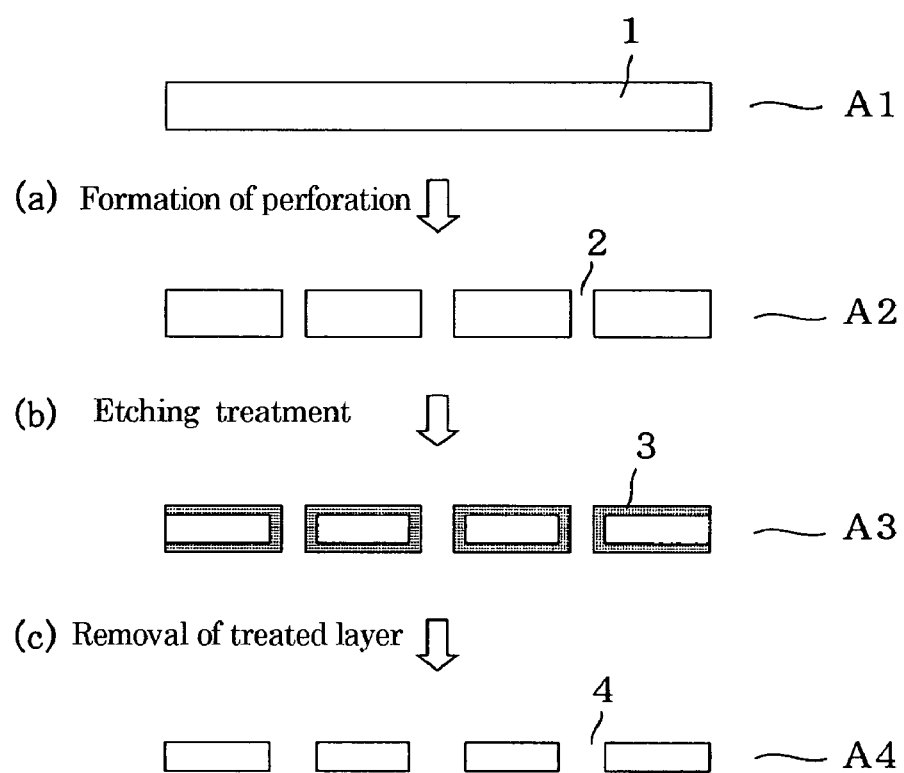
FIG. 1 is a process diagram showing an example of methods of the present invention for manufacturing a porous resin substrate in which perforations are formed.

1: porous resin substrate, 2: perforation, 3: etch treated layer,
4: perforation,
A1: porous resin substrate,
A2: porous resin substrate having perforations,
A3: porous resin substrate having an etch treated layer,
A4: porous resin substrate in which perforations are formed,
21: porous resin substrate, 22 and 23: mask layer,
24: perforation, 25: etch treated layer, 26: perforation,
B1: lamination, B2: lamination having perforations,
B3: lamination having an etch treated layer,
B4: lamination in which the treated layer is removed,
B5: porous resin substrate having perforations,
31: porous resin substrate, 32 and 33: mask layer, 34: perforation, 35: etch treated layer, 36: perforation, 37 and 38: plating catalyst, 39: plated metal layer, C1: lamination, C2: lamination having perforations, C3: lamination having an etch treated layer, C4: lamination in which the treated layer is removed, C5: lamination in which a plating catalyst is adhered, C6: porous resin substrate in which a plating catalyst is adhered to the wall faces of perforations, C7: porous resin substrate in which a plated metal layer is formed on the wall faces of perforations, 401: anisotropic conductive film, 402: gold-plated copper board, 403: copper pillar, 404: constant current supply, 405: voltmeter, 406: gravimeter.

THE BEST MODE FOR IMPLEMENTING THE INVENTION

1. Porous Resin Substrate (Base Film)

In the present invention, a porous resin substrate made of a resin material containing a fluoropolymer is used. Examples of resin materials constituting a porous resin substrate include a fluororesin, a fluororesin compound, fluoric rubber, a fluororubber compound and the like. The fluororesin compound is, for example, a composition of two or more kinds of fluororesin, a composition comprising a fluororesin and other resin, a resin composition of fluororesin and fluoric rubber, or the like. The fluororubber compound is, for example, a composition of two or more kinds of fluoric rubber, a composition of fluoric rubber and other rubber, a rubber composition of fluoric rubber and a fluororesin, or a rubber composition comprising fluoric rubber and a resin other than the fluororesin, or the like.

In order to choose a porous resin substrate which can endure processing such as a perforation method of the present invention, an etching treatment, and a process of adhering a conductive metal and which is suitable for use in the fields of electronics and medical treatment, it is preferable to select a porous resin substrate made of a fluororesin material superior in terms of heat resistance, processability, mechanical characteristics, dielectric property, and the like.

For example, preferably an anisotropic conductive sheet used in an electrical conductive test and an inspection of mutual electrical connection between circuit elements is made of a substrate (base film) having excellent heat resistance. Particularly, for a burn-in test, it is necessary to use a substrate having superior heat resistance property because a test of accelerated degradation under high temperature is performed in a state where an anisotropic conductive film is interposed between an testing object electrode of a circuit board and an inspection equipment electrode.

The fluoropolymers which form a porous resin substrate are, for example, fluororesins or fluoric rubber, such as polytetrafluoroethylene (PTFE), tetrafluoroethylene/hexafluoropropylene copolymer (FEP), tetrafluoroethylene/perfluoroalkylvinylether copolymer (PFA), polyvinylidene fluoride (PVDF), polyvinylidene fluoride copolymer, ethylene/tetrafluoroethylene copolymer (ETFE), etc.

Of the fluoropolymers, a fluororesin is preferable, and in particular, polytetrafluoroethylene is most preferable in view of heat resistance, chemical resistance, processability, mechanical characteristics, dielectric property (low dielectric constant), etc.

Examples of methods for preparing a porous resin substrate include such methods as pore-forming, phase separation, solvent extraction, expansion, laser irradiation, etc. The shape of the porous resin substrate may be determined according to the purpose of the use, such as sheet, tube, block, or the like, although in a number of cases, a sheet (including a film) form is adopted. For example, by using a porous resin sheet as the base film, it is possible to make an anisotropic conductive film (also referred to as "anisotropic conductive sheet") to have elasticity in the film thickness direction, and also relative dielectric constant can be further lowered.

The porous resin substrate preferably has a porosity in the range of 20-80%. Preferably, the porous resin substrate has a mean pore diameter of 10 μm or less, or a bubble point of 2 kPa or more, and from the viewpoint of providing fine pitch conductive parts (the parts which are afforded electrical conductivity), more preferably the mean pore diameter is 1 μm or less, and the bubble point is equal to or more than 10 kPa.

Of the porous resin substrates, the expanded porous PTFE sheet manufactured by an expansion method is a material which is superior as a base film of an anisotropic conductive film, since it has a uniform pore diameter distribution as well as excellent properties with respect to processability, mechanical characteristics, dielectric property, etc. Also, the expanded porous PTFE sheet can preferably be used as a medical device such as a patch restoration material.

The expanded porous PTFE sheet to be used in the present invention can be manufactured by, for example, a method disclosed in Japanese patent publication No. S42-13560. First, a non-sintered PTFE powder is mixed with a liquid lubricant and extruded into a tubular or board-like shape by ram extrusion. For obtaining a sheet with thin thickness, the extruded board-shaped product is rolled by a reduction roll. After the extrusion or rolling process, a liquid lubricant is removed from the extruded product or the rolled product, if it is needed.

When the extruded board-shaped product or the rolled product thus obtained is expanded in a uniaxial direction or biaxial directions, an unsintered porous PTFE sheet is obtained. It is possible to obtain a high-strength expanded porous PTFE sheet by heating the unsintered porous PTFE sheet at a temperature equal to or more than 327° C., which is the melting point of PTFE, while fixing it so as not to shrink, and by sintering it so as to fix the expanded structure. If an extruded tubular product is uniaxially expanded and sintered, a porous PTFE tube can be obtained. The expanded porous PTFE tube can be processed into a sheet form by cutting it longitudinally.

The expanded porous PTFE sheet has a microporous structure (also referred to as "microfibrous structure") consisting of a number of thin fibrils and a number of nodes connected one another by the fibrils. In the expanded porous PTFE sheet, this microporous structure forms porous spaces. Therefore, in the expanded porous PTFE sheet, the resin part of the microporous structure is composed of fibrils and nodes, and in the microporous structure, the spaces are formed by the fibrils and nodes. The expanded porous PTFE sheet is superior in terms of resilience in the film thickness direction and has an excellent property of elastic recovery.

2. Perforation Method

In the present invention, at least one perforation is formed penetrating in the thickness direction from a first surface to a second surface in a porous resin substrate made of a resin material containing a fluoropolymer. When the porous resin substrate is a sheet (film), the two widest surfaces are the first surface and the second surface.

Methods of forming a perforation (through hole) are, for example, (i) a mechanical perforation method, (ii) an etching method with laser ablation technique, and (iii) a method in which an ultrasonic head having at least one oscillator provided at the tip part thereof is used in a manner such that the tip of the oscillator is forced so that ultrasonic wave energy may be applied.

Machining methods which can be adopted for mechanical perforation are, for example, a pressing method, a punching method, and a drilling method. According to a machining method, it is possible to form, at a low cost, a perforation having a comparatively large diameter: for example, 100 μm or more, in many cases 200 μm or more, and furthermore 300 μm or more. It is also possible to form a perforation having a smaller diameter, if it is needed.

In order to form a through hole by laser processing, it is preferable to adopt a method in which patterned perforations are formed by irradiating a laser beam onto the surface of a compound sheet through a light shielding sheet having a plurality of light transmitting parts (openings) which are respectively provided independently in a pre-determined pattern. The parts where a laser beam has irradiated penetrating from the plurality of openings of the light shielding sheet are etched and perforations are formed. According to this method, it is possible to form perforations having a comparatively small diameter, for example, 20-150 μm, in many cases 25-100 μm, and furthermore 30-80 μm. It is also possible to form, by the laser processing method, a perforation having a smaller diameter as needed.

According to the ultrasonic wave method, patterned perforations are formed by inflicting ultrasonic wave energy on a porous resin substrate with an ultrasonic head having at least one oscillator at the tip part thereof. Ultrasonic wave energy is inflicted only at the vicinity where the tip of the oscillator contacted on the porous resin substrate, and the temperature rises locally with the vibration energy applied by the ultrasonic wave such that the resin is cut away easily so that a perforation is formed.

The shape of a perforation (through hole) may be arbitrarily determined: circular, elliptical, stellar, octagonal, hexagonal, square, triangular, etc. The perforation diameter (through-hole diameter) can be generally 5-100 μm in the use field where a perforation having a small through-hole diameter is suitable, and it can further be decreased to 5-30 μm. On the other hand, in the field where a perforation having a comparatively large through-hole diameter is suitable, the perforation diameter is generally 100-3000 μm, and in a number of cases 150-2000 μm, and more preferably it can be increased to 200-1500 μm.

At least one perforation is formed in a porous resin substrate, and generally, a plurality of perforations are formed at a plurality of positions in the porous resin substrate. For example, it is possible to form perforations in a pre-determined pattern in accordance with the distribution of electrodes on the circuit board, or the like.

3. Etchant

The present invention uses an etchant containing an alkali metal. The alkali metal is preferably Na (sodium) or Li (lithium), and Na is particularly preferable.

The etchant preferably contains an alkali metal and an aromatic compound. The aromatic compound is preferably naphthalene, benzophenone, or the like, and most preferable of these is naphthalene. As for the etchant, a sodium-naphthalene etchant is particularly preferable. Such sodium-naphthalene etchant available is, for example, FluoroEtch (registered trademark) from Acton Technologies, Inc. Of course, any other suitable sodium-naphthalene etchant available on the market can be used.

4. Compound Capable of Oxidization and the Solution Thereof

In the present invention, a compound capable of oxidizing or the solution thereof is used in order to remove, by oxidation decomposition, a degenerative layer (etch treated layer) formed in the etching treatment. As to the oxidizable compound, hydrogen peroxide which is liquid at normal temperature is preferable. The solutions of the oxidizable compound are, for example, oxygenated water, hypochlorite solution, and chlorite solution. The concentration of these solutions is generally about 1-60% by weight, preferably about 5-50% by weight, and more preferably about 10-40% by weight, depending on the degree to which the oxidizable compound can be dissolved in water. Since hydrogen peroxide is an unstable liquid, it is preferable to use it as a solution (oxygenated water).

5. Method of Manufacturing a Perforated Porous Resin Substrate

In the present invention, a porous resin substrate which is perforated by the following Steps 1 to 3 is manufactured:

(1) Step 1 of forming at least one perforation penetrating in the thickness direction from a first surface to a second surface in a porous resin substrate made of a resin material containing a fluoropolymer;

(2) Step 2 of etching treatment conducted by putting an etchant containing an alkali metal in contact with the wall face of each perforation; and (3) Step 3 of putting an oxidizable compound or the solution thereof in contact with a degenerative layer generated by the etching treatment, and thereby removing the degenerative layer.

These steps 1-3 may include an additional process or may be composed of a plurality of processes, respectively.

With reference to the drawings, each process of the present invention will be explained below. FIG. 1 is a flow diagram (process diagram) which shows a typical process of a manufacturing method of the present invention.

As shown in FIG. 1, a porous resin substrate 1 (A1) is prepared.

In the perforation forming process 1 of the present invention, generally a plurality of perforations 2, 2 . . . are formed by machining or laser processing in the thickness direction in the porous resin substrate (FIG. 1(a)). The wall surfaces of the formed perforation 2, 2 . . . are made nonporous at least partly or wholly.

In the etching treatment of Step 2, an etchant which contains an alkali metal is put in contact with the wall surfaces of perforations 2, 2 . . . and thereby an etching treatment is performed (FIG. 1(b)). The etching treatment is generally performed in a manner such that a porous resin substrate (A2) having perforations is immersed in the etchant. The immersion into the etchant is implemented generally for a time period within a range of 1-60 minutes, preferably 3-40 minutes, and more preferably 5-20 minutes, while stirring the etchant.

If the immersion time is too short, it will be difficult to achieve an effect of the etching treatment, and if it is too long, the changing of the surface quality and the deterioration of the porous resin substrate will progress too much, depending on the kind of the etchant. Generally, the etching treatment is continued until the part which corresponds to the thickness of the wall face part which has been made nonporous in a perforation changes in color due to the etching treatment.

The entire porous resin substrate (A2) in which perforations are formed is immersed in the etchant, and thereby the whole surface of the porous resin substrate as well as the wall face of each perforation is etch treated, and consequently the color changes to brown. The part where the color has changed due to the etching treatment is called a degenerative layer 3, and such part is also called an etch treated layer (the "treated layer") or a brittle layer.

If a porous resin substrate is left in a state as it is etch treated, the surface deterioration progresses due to the quality change, and the degenerative layer tends to easily be exfoliated. When a cellophane adhesive tape defined by JIS Z 1522 is put and pressed on this degenerative layer so that an 180 degree peel-off test is conducted according to JIS Z 0237, the brown degenerative layer is observed to exfoliate.

After the etching treatment of Step 2 is completed, it is preferable to wash the etch treated porous resin substrate (A3) with water or alcohol and to sufficiently remove the etchant from the inside as well as the surface of the porous structure.

In Step 3 of the present invention, the degenerative layer generated due to the etching treatment is put in contact with an oxidizable compound or the solution thereof so as to be removed (FIG. 1(c)). Such contact in Step 3 is generally implemented by impregnating the etch treated porous resin substrate (A3) with an oxidizable compound or the solution thereof.

The immersion time is generally from about 10 minutes to 50 hours, preferably, 1 to 30 hours, and more preferably 2 to 24 hours depending on the thickness of the degenerative layer and the oxidizability of the oxidation decomposition of the compound or the solution. It is generally preferable that the immersion treatment be performed for a time period until the part which is discolored to brown by the etch treatment (the degenerative layer) recovers the original tone of color (generally, white color) by the oxidation decomposition.

In this way, the degenerative layer 3 formed by the etching treatment is removed by the oxidation decomposition, and a porous resin substrate (A4) having perforations 4, 4 . . . can be obtained. When the wall faces of the perforations 4, 4 . . . are observed with a scanning electron microscope (SEM), it can be confirmed that they have a porous structure, not only it has not changed color to the brown. In the case where the porous resin substrate is an expanded porous PTFE substrate, it is possible to observe with SEM that the porous resin substrate have the microporous structure consisting of fibrils and nodes which an expanded porous PTFE has inherently.

Figure 2:
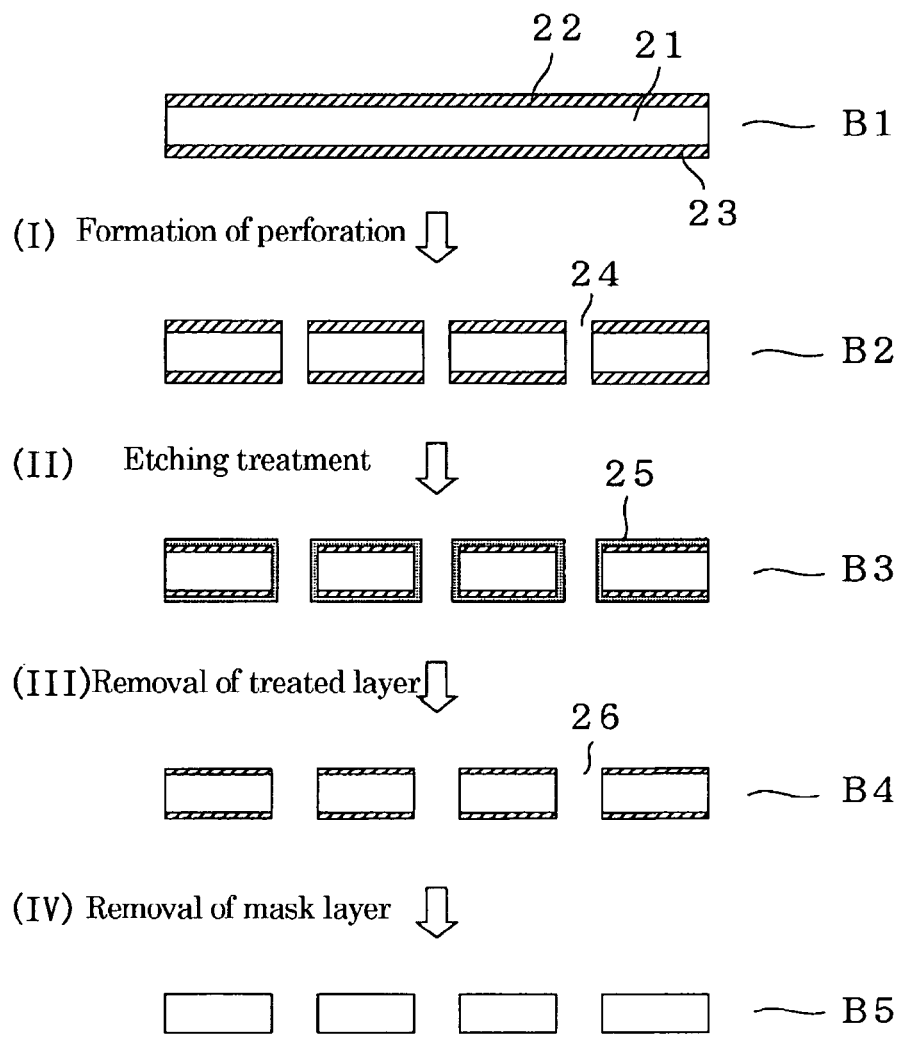
FIG. 2 is a process diagram showing another example of methods of the present invention for manufacturing a porous resin substrate in which perforations are formed.

In the method shown in FIG. 1, the etching treatment causes the entire surface, as well as the wall faces of perforations, of the porous resin substrate to discolor to brown and to become a degenerative layer. It is possible to adopt a method in which a mask is used to protect the surface of the porous resin substrate from the etching treatment as shown in FIG. 2.

That is, it is possible to manufacture a perforated porous resin substrate by the following processes a) to e) in the above-mentioned Steps 1 to 3:

(a) Process a of forming a 3-layer lamination by stacking a resin layer as a mask layer on both faces of a porous resin substrate made of a resin material containing a fluoropolymer (Step 1a);

(b) Process b of forming at least one perforation penetrating in the thickness direction from a first surface to a second surface of the lamination (Step 1b);

(c) Process c of etching treatment conducted by putting an etchant containing an alkali metal in contact with the wall face of each perforation (Step 2);

(d) Process d of removing a degenerative layer by putting an oxidizable compound or the solution thereof in contact with the degenerative layer, the degenerative layer having been generated by the etching treatment (Step 3a); and (e) Process e of peeling off the mask layers from both faces of the porous resin substrate (Step 3b).

The processes (a) and (b) show that the perforation process of Step 1 comprises two processes (1a) and (1b). The process (c) corresponds to the etching treatment of Step 2. The processes (d) and (e) show that Step 3 comprises two steps (3a) and (3b).

A resin material is used as the mask material. As for the resin material, a porous resin material made of a resin material containing a fluoropolymer can be used, but a porous or nonporous other resin material can also be used. From the viewpoint of balance in the properties of melt-bonding and exfoliation between layers, it is preferable to use as the mask material a porous resin material formed from a porous resin material having the same properties as the porous resin substrate, i.e. a resin material containing a fluoropolymer.

As shown in FIG. 2, mask layers 22 and 23 arranged on both faces of a porous resin substrate 21 are melt-bonded to be integrated. When an expanded porous PTFE sheet is used as the porous resin substrate 21, it is preferable to use the same kind of an expanded porous PTFE sheet as the mask layers 22 and 23. These three layers can be formed into a lamination (B1) in which the respective layers are melt-bonded together by heating and compressing them. This lamination can be exfoliated easily in a later process.

Perforations 24 and 24 . . . are formed in the lamination (B1) (FIG. 2(I)). The lamination (B2) in which the perforations are formed is processed by etching. An etch treated layer (degenerative layer) 25 is formed on the surfaces of the mask layer and the wall faces of the perforations (FIG. 2(II)). The etch treated lamination (B3) is put in contact with an oxidizable compound or the solution thereof so that the treated layers (the degenerative layers) 25 are removed (FIG. 2(III)). The perforation, the etching treatment, and the removal of the treated layers, etc. are performed in the same methods as described above.

Thus, the treated layer (the degenerative layer) 25 is removed and the lamination (B4) having perforations 26 and 26 . . . which exhibit a porous structure is obtained. Subsequently, when the mask layers 22 and 23 are peeled off from both faces of the lamination (B4), a porous resin substrate (B5) having perforations on the wall faces of which have a porous structure can be obtained.

The methods shown in FIGS. 1 and 2 are such that a porous resin substrate is provided with a perforation directly drilled, thereby causing the wall face of the perforation to easily be made nonporous. It is possible, however, to adopt a method in which a perforation is made after a solid has been made from a liquid or solution impregnated in the inside of the porous structure of the porous resin substrate before the perforation is made. According to this method, it is possible to lessen the extent to which the wall face of a perforation is made nonporous. The solid can be removed by melting or dissolving at a suitable stage of processing, and it is possible to maintain the porous structure of the entire porous resin substrate.

That is, it is possible to form a perforation in the porous resin substrate according to the following processes 1-a to 1-d in Step 1:

(a) Process 1-a of impregnating a liquid or solution to the inside of the porous structure of a porous resin substrate which is made of a resin material containing a fluoropolymer;

(b) Process 1-b of forming a solid from the liquid or solution thus impregnated;

(c) Process 1-c of forming at least one perforation penetrating in the thickness direction from a first surface to a second surface in the porous resin substrate in which the solid has been formed in the porous structure; and (d) Process 1-d of removing the solid from the inside of the porous structure by melting or dissolving the solid.

In the method in which a perforation is made after forming a lamination, the lamination is formed beforehand prior to the process 1-a.

The liquid and the solution may be sufficient if they are in a state of liquid or solution when they are impregnated to the inside of the porous structure of the porous resin substrate. For example, in the case of a substance having a high solidification point or high melting point and which exhibits a solid state at normal temperature (a temperature within the range of 15-30° C.), the substance is solidified by cooling to a temperature equal to or below the solidification point or the melting point after it has been made liquid (or solution) by heating and impregnated to the inside of the porous structure of the porous resin substrate.

In the case of a substance exhibiting a liquid state at normal temperature, it is solidified by cooling to a temperature equal to or below the solidification point or melting point after its impregnation has been completed. In the case of a solution, after impregnation is completed, the solvent may be volatilized so that the solute solid may be precipitated. In the case of a substance which can form a solid by chemical reaction of a polymeric monomer or the like, a solid such as a solid polymer is formed by a chemical reaction such as polymerization reaction after the impregnation has been completed in a liquid state or in a form of solution.

The removal of solids from the inside of the porous structure may be done by heating the solids to a temperature exceeding the solidification point or the melting point so that they may be removed as liquid or by dissolving the solids using a solvent so that they may be removed as a solution. The method in which such removal is done using a solvent is sometimes called extraction or elution using a solvent.

In the case of a liquid being solidified by solidification or cooling, the solidification point or the melting point is preferably −150 to 150° C., and more preferably −80 to 100° C. When the solidification point or the melting point is too low, the cost will be too expensive. If the solidification point or the melting point is too high, a possible shortcoming will be that the deterioration of the porous resin substrate is facilitated since the solidification point or the melting point may approach the softening point or the decomposition point of the porous resin substrate. Also, if the solidification point or the melting point is too high, the liquid made by heating will have high viscosity, which will require a vacuum operation for impregnation, resulting in a complex operation.

As for the liquid (substance) which can be solidified by solidification or cooling, it is sufficient if the liquid (substance) is a liquid that can be solidified at a temperature below the softening point or the decomposition point of the porous resin substrate to be used, and preferably it has a solidification point or melting point within the above-mentioned temperature range. Examples of such liquids (substances) include water, alcohol, hydrocarbon, polymer, and a mixture comprising two or more kinds thereof.

Also, liquids (substances) that can be used for impregnation are, for example, a polymer which is liquid at normal temperature, a polymer having a low melting point which is solid at normal temperature, paraffin (alkane; a kind of hydrocarbon), etc. These polymers and paraffin can also be used as a solution.

In the case where a substance which is solid at normal temperature is used as a solution, it is advisable to choose a solvent that is capable of dissolving a substance which is solid at normal temperature, such as a polymer, paraffin, naphthalene, etc. and that is insoluble or least soluble to a porous resin substrate. Preferably, the solvent is one that does not erode, dissolve, or decompose a porous resin substrate.

It is preferable to apply the solution to a method in which the solution is impregnated into the porous structure of a porous resin substrate by a solution casting method (cast method) or an immersion method (dip method) and in which a solute solid is subsequently precipitated by removing a solvent. After perforation is completed, solids may be eluted using the used solvent from the inside of the porous structure.

If a soluble polymer or paraffin having a high melting point is used as the above-mentioned liquid or solution, it is possible to perforate with high precision as well as to use the soluble polymer or paraffin as the masking material when selectively affording electrical conductivity to the wall face of a perforation.

As for the soluble polymer, it is preferable to use a polymer in which the solvent for dissolving the soluble polymer can easily penetrate into the porous structure of the porous resin substrate. From the viewpoint of forming a perforation (through hole) easily at normal temperature by a mechanical perforation method, the soluble polymer is preferably one which is solid at normal temperature (15 to 30° C.).

A preferable soluble polymer is an acrylic type resin. Examples of acrylic type resins include a homopolymer or copolymer of acrylic acid alkyl ester (i.e., acrylate) such as polymethyl methacrylate (PMMA; acrylic resin) or methacrylic acid alkyl ester (i.e., methacrylate).

A paraffin that is solid at normal temperature is preferable from the viewpoint of facilitating the formation of a perforation at normal temperature. The melting point of the paraffin is preferably 15° C. or higher, and more preferably 20° C. or higher, and most preferably 25° C. or higher. If the melting point of the paraffin is too low, it is necessary to maintain an operational environment at low temperature or to cool the porous resin substrate for forming a perforation by machining, which is undesirable from the viewpoint of energy cost.

Preferable examples of paraffins include hexadecane, heptadecane, octadecane, nonadecane, icosane, henicosane, docosane, triacontane, heptacontane, etc. The paraffin can be used singly or in combination of two or more kinds thereof.

The typical example of a compound which can form a solid by chemical reaction is a polymeric monomer. The polymeric monomer that can be used is a unifunctional monomer, or preferably unifunctional monomer having one acryloyl group or one methacroyl group. It is undesirable to use a multifunctional monomer having two or more functions since solvent extraction will become impossible because the multifunctional monomer causes the resultant monomer to be insoluble or least soluble to a solvent because of a crosslinked structure formed by polymerization reaction.

The unifunctional monomer to be used is not particularly limited as far as it can form a polymer soluble to a solvent after polymerization reaction. Unifunctional monomers that can be used are, for example, acrylate and methacrylate used for forming the above-mentioned soluble polymers. Of these, preferable are methyl methacrylate, methyl acrylate, isobornyl acrylate, and isobornyl methacrylate.

The polymers formed from these polymeric monomers are soluble to organic solvents such as xylene, methyl ethyl ketone, acetone, etc. These polymeric monomers can be used singly or in combination of two or more kinds thereof. If a solution in which a polymer obtained by polymerizing a polymeric monomer in a polymeric monomer beforehand is dissolved is used, it is possible to suppress volume shrinkage caused when the polymeric monomers are polymerized.

The methods of polymerizing polymeric monomers include a thermal polymerization method and a photo polymerization method. In the case of photo polymerization, a photoinitiator is added to a polymeric monomer or a polymeric monomer solution. The ratio of the photoinitiator to be added is generally 0.1 to 5% by weight on the whole monomer quantity basis. Examples of photoinitiators include benzophenone, thioxanthone, etc., as a hydrogen abstraction type, and α-amino alkyl phenone, α-hydroxy alkyl phenone, acyl phosphine oxide, etc. as a unimolecular bond cleavage type.

For performing thermal polymerization, an azo compound such as 2,2'-azobis-isobutyronitrile or peroxide such as dicmyl peroxide is added as a thermoinitiator to a polymeric monomer or a polymeric monomer solution. The ratio of the thermoinitiator to be added is generally 0.1 to 5% by weight with respect to the total monomer quantity.

If it is necessary, in addition to the polymerization initiator, additives such as a deter gent, antioxidant, photosensitizer, lubricant, mold release agent, etc. may be added to the polymeric monomer or the polymeric monomer solution.

The solution casting method or the immersion method can be used as a method for impregnating a polymeric monomer into the porous structure of a porous resin substrate. After such impregnation, a solid polymer is generated by performing polymerization reaction by means of light irradiation or heating according to the kind of the polymerization initiator added to the polymeric monomer.

6. Method of Manufacturing a Porous Resin Substrate in which Electrical Conductivity is Afforded to the Wall Face of a Perforation According to the present invention, it is possible to manufacture a porous substrate in which the wall face of a perforation is selectively afforded electrical conductivity using the above-mentioned manufacturing method of a perforated porous resin substrate.

That is, a method of the present invention for manufacturing a porous resin substrate having a perforation the wall face of which is selectively afforded electrical conductivity includes the following Steps 1 to 5:

(1) Step 1 of forming at least one perforation penetrating in the thickness direction from a first surface to a second surface in a porous resin substrate made of a resin material containing a fluoropolymer;

(2) Step 2 of etching treatment conducted by putting an etchant containing an alkali metal in contact with the wall face of each perforation; and (3) Step 3 of putting an oxidizable compound or the solution thereof in contact with a degenerative layer generated by the etching treatment, and thereby removing the degenerative layer;

(4) Step 4 of adhering a catalyst for facilitating the reduction reaction of a metal ion to the wall face of each perforation; and (5) Step 5 of adhering a conductive metal to the wall face of each perforation by means of the catalyst.

The Steps 1 to 3 can adopt the same methods as described above. In Step 4, it is preferable to adopt a method in which the catalyst for facilitating the reduction reaction of the metal ion is adhered only to the wall face of a perforation. Examples of the methods for selectively adhering a catalyst only to the wall face of a perforation include Several methods.

One of the methods is a method in which the above-mentioned lamination is utilized. That is, a perforation is formed in a porous resin substrate and a catalyst for facilitating the reduction reaction of a metal ion is adhered to the wall face of the perforation by the following processes A to F in Steps 1 to 4:

(A) Process A of forming a three layered lamination by laminating a resin layer as a mask layer onto both faces of a porous resin substrate made of a resin material containing a fluoropolymer (Step 1A);

(B) Process B of forming at least one perforation penetrating in the thickness direction from a first surface to a second surface in the lamination (Step 1B);

(C) Process C of etching treatment conducted by putting an etchant containing an alkali metal in contact with the wall face of a perforation (Step 2);

(D) Process D of putting an oxidizable compound or the solution thereof in contact with a degenerative layer generated by the etching treatment, and thereby removing the degenerative layer (Step 3);

(E) Process E of adhering a catalyst for facilitating the reduction reaction of a metal ion to the surface of the lamination including the wall face of each perforation; and (F) Process F of peeling off the mask layers from both faces of the porous resin substrate (Step 4B).

The above-mentioned method will be explained referring to FIG. 3. First, a lamination (C1) is prepared by melt-bonding mask layers 32 and 33 made of a resin material onto both faces of a porous resin substrate 31. From the viewpoint of adhesiveness by thermal bonding between the respective layers, it is preferable that the resin material which forms a mask layer be the same kind of porous resin material as that of the porous resin substrate. Perforations 34 and 34 . . . are formed in this lamination (C1) (FIG. 3($i$)). Next, the lamination (C2) in which perforations have been formed is subjected to etching treatment (FIG. 3($ii$)). The lamination (C3) in which an etch treated layer 35 is formed is treated with an oxidizable compound or the solution thereof so that the treated layer 35 is removed (FIG. 3($iii$)). The processes described heretofore are the same as processes (I) to (III) shown in FIG. 2.

Figure 3:
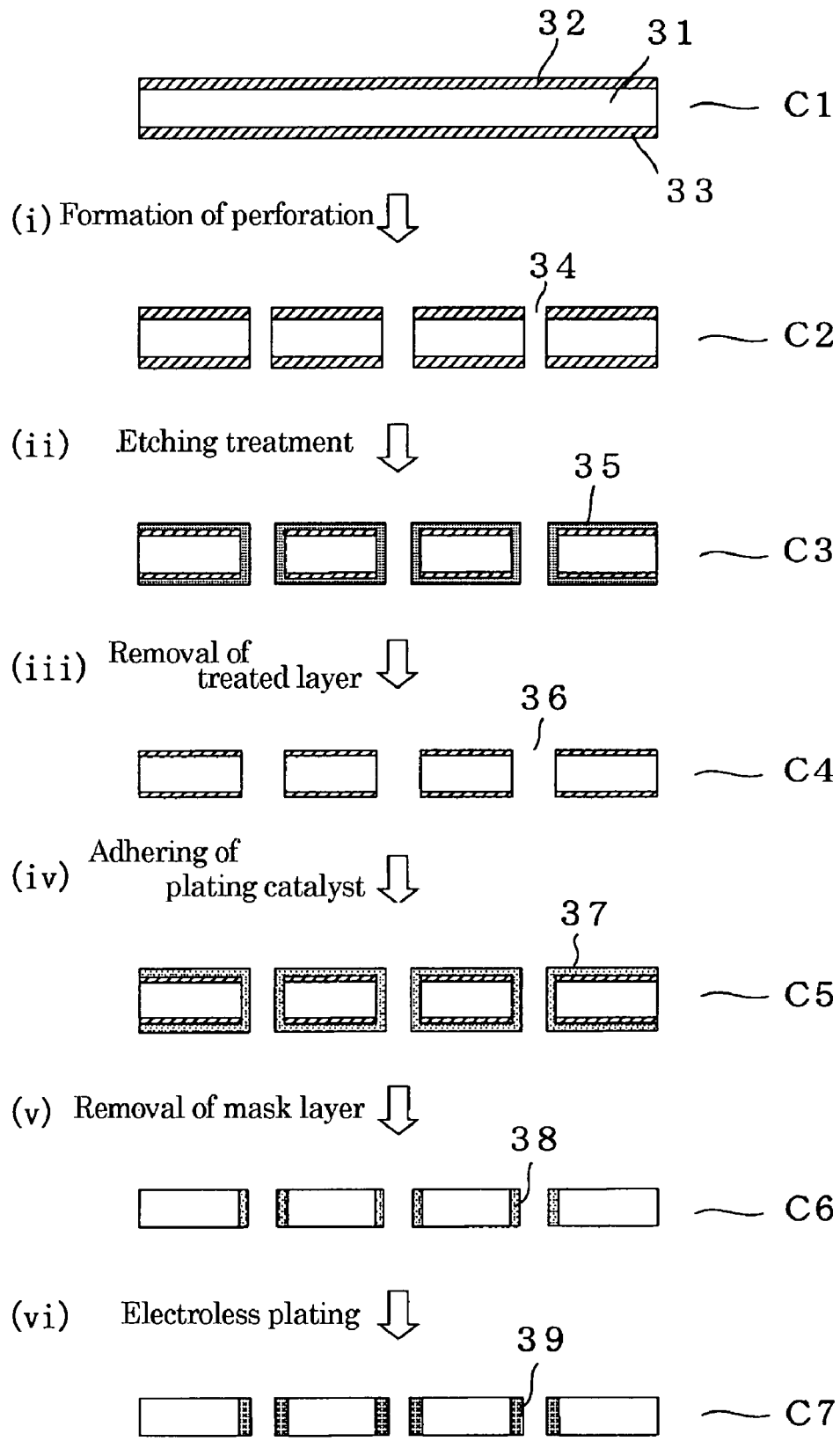
FIG. 3 is a process diagram showing an example of methods of the present invention for manufacturing a porous resin substrate in which the wall faces of perforations are afforded electrical conductivity.

Next, a catalyst (also referred to as "plating catalyst") 37 for facilitating the reduction reaction of the metal ion is adhered to the lamination (C4) in which the treated layer is removed (FIG. 3($iv$)). The plating catalyst adheres to the wall face of a perforation and the surface of the mask layer, but it does not adhere to the surface of the porous resin substrate 31. Thus, a porous resin substrate (C6) in which the plating catalyst 38 has adhered only to the wall face of a perforation is obtained by peeling off the mask layers 32 and 33 from the lamination (C5) to which the plating catalyst is adhered.

By performing electroless plating using this plating catalyst 38, a porous resin substrate (C7) is obtained in which a plated metal layer (conductive metal) 39 is adhered only to the wall face of a perforation.

It is preferable to adopt the following method as a modified method of the above-described method. That is, a perforation is formed in a porous resin substrate and a catalyst for facilitating the reduction reaction of a metal ion is adhered to the wall face of the perforation by the following processes (i) to (ix) in Steps 1 to 4:

(i) Process i of forming a three layered lamination by laminating a resin layer as a mask layer onto both faces of a porous resin substrate made of a resin material containing a fluoropolymer (Step 1-A);

(ii) Process ii of impregnating the inside of the porous structure of the lamination with a soluble polymer, or a paraffin or a compound which can form a solid by chemical reaction (Step 1-B);

(iii) Process iii of forming a solid from the soluble polymer, the paraffin, or the compound which can form a solid by chemical reaction (Step 1-C);

(iv) Process iv of forming at least one perforation penetrating in the thickness direction from a first surface to a second surface in the lamination having a porous structure in which the solid is formed (Step 1-D);

(v) Process v of removing the solid from the inside of the porous structure by dissolving the solid (Step 1-E);

(vi) Process vi of etching treatment conducted by putting an etchant containing an alkali metal in contact with the wall face of a perforation (Step 2);

(vii) Process vii of putting an oxidizable compound or the solution thereof in contact with a degenerative layer generated by the etching treatment, and thereby removing the degenerative layer (Step 3);

(viii) Process viii of adhering a catalyst for facilitating the reduction reaction of a metal ion to the surface of the lamination including the wall face of each perforation; (Step 4-A); and (ix) Process ix of peeling off the mask layers from both faces of the porous resin substrate (Step 4B).

In the above-described method, it is preferable to use a porous resin material as a mask layer from the viewpoint of easily impregnating a soluble polymer, paraffin or a compound capable of forming a solid by chemical reaction into the porous structure of the porous resin substrate of the lamination. The porous resin material which forms the mask layer is preferably the same kind of material as that of the porous resin substrate.

Instead of the soluble polymer, paraffin, or the compound which can form a solid by chemical reaction, it is possible to use water or alcohol, or hydrocarbon other than paraffin. However, it is preferable to use the soluble polymer, paraffin, or the compound which can form a solid by chemical reaction, since not only it is unnecessary to adopt a cold condition for making a solid body, but also it makes possible to prevent the porous structure of the wall surface from easily damaged by perforation.

Another method is such that a perforation is formed in a porous resin substrate and subsequently a catalyst for facilitating the reduction reaction of a metal ion is adhered to the wall face of the perforation by the following processes I to VII in Steps 1 to 4:

(I) Process I of adhering a soluble polymer, or paraffin or a compound capable of forming a solid by chemical reaction to, and impregnating the same into, the porous structure as well as both faces of the porous resin substrate made of a resin material containing a fluoropolymer (Step 1-I);

(II) Process II of forming a compound sheet in which a solid form is made from the adhered and impregnated soluble polymer, paraffin or compound capable of forming a solid by chemical reaction such that a solid layer is formed on both faces of the porous resin substrate and the solid is impregnated into the porous structure (Step 1-II);

(III) Process III of forming at least one perforation penetrating in the thickness direction from a first surface to a second surface in the compound sheet (Step 1-III);

(IV) Process IV of etching treatment conducted by putting a etchant containing an alkali metal in contact with the wall face of each perforation (Step 2);

(V) Process V of putting an oxidizable compound or the solution thereof in contact with a degenerative layer generated by the etching treatment, and thereby removing the degenerative layer (Step 3);

(VI) Process VI of adhering a catalyst for facilitating the reduction reaction of a metal ion to the surface of the compound sheet including the wall face of a perforation (Step 4-I); and (VII) Process VII of removing the solid from the compound sheet (Step 4-II).

When the soluble polymer or paraffin is removed from the compound sheet, the catalyst remains adhering to the wall face of a perforation of the porous resin substrate.

The soluble polymer, paraffin, and compound capable of forming a solid by chemical reaction, which are used in these methods, can be the same as those described above. The solvent used for dissolving and removing the soluble polymer, paraffin, etc. is not particularly limited, provided that it can dissolve the same. However, a solvent that is insoluble or least soluble to the porous resin substrate is preferable. In the case where an expanded porous PTFE sheet is used as the porous resin substrate and PMMA is used as the soluble polymer, it is preferable to use a polar solvent such as acetone, tetrahydrofuran, etc. as the solvent. In case of the paraffin also, the removal can be accomplished by dissolving using hot xylene or the like. Generally, the dissolving and removal of the soluble polymer and paraffin are conducted by a method in which a lamination and a compound sheet are immersed in a solvent.

In these methods, the catalyst for facilitating the reduction reaction of a metal ion may be adhered in a manner such that the perforated porous resin substrate, lamination or compound sheet is immersed while sufficiently stirring, for example, in a solution containing a palladium-tin colloidal catalyst.

In the present invention, it is possible to selectively adhere a conductive metal to the wall surface of a perforation (through hole) using the remaining catalyst adhered to the wall surface. A preferable method to be adopted for adhering the conductive metal is an electroless plating method.

Prior to performing the electroless plating, the catalyst remaining in the wall face of a perforation (e.g., palladium-tin) is activated. More specifically, the catalyst is activated by dissolving tin by immersion in an organic acid salt available on the market as an activator for a plating catalyst.

A porous resin substrate in which the wall face of a perforation is provided with a catalyst is immersed in an electroless plating solution, and thereby a conductive metal can be deposited only on the wall face of the perforation, and consequently a tubular conductive part (also called as "electrically conductive path" or "electrode") is formed. Examples of such conductive metals include copper, nickel, silver, gold, nickel alloy, etc. However, in the case where high conductivity is needed in particular, it is preferable to use copper.

When an expanded porous PTFE sheet is used, it is possible to control the adhesion condition of conductive metal by controlling plating time since plating particles (crystal grains) are extracted in such a way as to twine around a fibril exposed at the wall face of a perforation of the porous PTFE sheet at the initial stage. If the electroless plating time is too short, it will be difficult to obtain conductivity in a film thickness direction. If the electroless plating time is too long, the conductive metal will turn into a metallic solid mass and accordingly the elastic recovery of the sheet at a compressive load of usual use will become difficult. A suitable quantity of plating will make it possible to form a conductive metal layer in a condition where a porous structure is maintained and to afford elasticity as well as conductivity in the film thickness direction simultaneously.

The thickness of a resin part in the microporous structure (for example, the thickness of a fibril of an expanded porous PTFE sheet) is preferably equal to or less than 50 µm. The particle diameter of conductive metal is preferably about 0.001 to 5 µm. It is preferable to design the adhesion quantity of the conductive metal to be about 0.01 to 4.0 g/ml in order to maintain resilience and a porous structure.

It is preferable that the tubular conductive part prepared as described above use an antioxidant or be coated with a precious metal or a precious metal alloy in order to prevent oxidation and to enhance the property of electric contact. The precious metal is preferably palladium, rhodium, or gold from the viewpoint of small electric resistance. The thickness of the coating layer of the precious metal is preferably 0.005 to 0.5 μm, and more preferably 0.01-0.1 μm. If the thickness of the coating layer is too thin, the improvement in the electric contact property is less, and if it is too thick, the coating layer tends to easily peel off thus, neither is preferable. In the case of coating a conductive part with gold, it is effective to adopt a method in which replacement gold plating is performed after coating a conductive metal layer with nickel about 8 nm thick, for example.

According to the manufacturing method of the present invention, it is possible to form perforations penetrating from a first surface to a second surface at a plurality of positions in a porous resin substrate, and to make an anisotropic conductive film which has conductive parts formed of conductive metal adhering to the resin part of the porous structure in the wall faces of the perforations and in which electrical conductivity can be afforded only in a film thickness direction by the conductive parts.

According to the manufacturing method of the present invention, it is possible to obtain a porous resin substrate in which electrical conductivity is afforded to the wall face of a perforation. This porous resin substrate does not have an etch treated layer (degenerative layer) which is inferior in mechanical characteristics, and the wall faces of its perforations have a porous structure. Therefore, the porous resin substrate not only has the superior mechanical characteristics and heat resistance that are inherent in fluoropolymer, but also exhibits superior electrical characteristics and elastic recovery. The plating thereof does not exfoliate even if a compression is applied in a film thickness direction. The porous resin substrate in which electrical conductivity is afforded to the wall face of a perforation is preferably used as an anisotropic conductive film.

The present invention will be described herein below, more specifically giving Examples and Comparative Examples. However, the present invention is not limited to these Examples. The methods for measuring the characteristics are as follows.

(1) Porosity:

The porosity of the porous PTFE film prepared by an expansion method was measured according to ASTM D-792.

(2) Bubble Point (BP):

The bubble point of the porous PTFE film made by an expansion method was measured using isopropylalcohol according to ASTM F-316-76.

Figure 4:
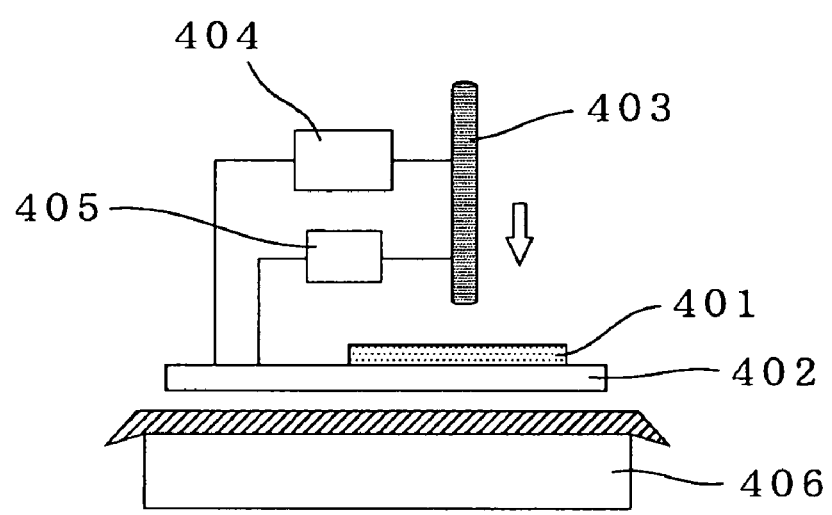
FIG. 4 is a sectional outline view of equipment for confirmation of a conduction commencement load on an anisotropic conductive film.

(3) Conduction Commencement Load:

The conduction commencement load of an anisotropic conductive film was measured using a conduction confirmation equipment shown in FIG. 4. In the conduction confirmation equipment shown in FIG. 4, a gold plated copper board (also called "Au board") 402 on which the anisotropic conductive film 401 was placed was put on a gravimeter 406. A load was applied using a copper pillar 403 as a probe having an outer diameter of 2 mmφ. The resistance value of the anisotropic conductive sheet was measured by the four-terminal method. This equipment is equipped with a constant current supply 404 and a voltmeter 405.

EXAMPLE 1

A porous polytetrafluoroethylene substrate having a porosity of 60%, a mean pore diameter of 0.1 μm (isopropylalcohol bubble point of 150 kPa), and a thickness of 60 μm was prepared. This porous polytetrafluoroethylene substrate, which was an expanded porous PTFE sheet made by an expansion method, has a microporous structure consisting of a number of fibrils and a number of nodes connected by the fibrils.

Perforations (through holes) of 250 μm in diameter were formed using a drill at a turning speed 100000 r/min at a plurality of positions on the expanded porous PTFE sheet. When the expanded porous PTFE sheet thus perforated was immersed in a sodium-naphthalene etchant ("FluoroEtch" made by Acton Technologies, Inc.) for 10 minutes while stirring, the surface of the sheet discolored from white to brown. The expanded porous PTFE sheet was taken out of the etchant, washed with water, and further washed with ethanol, and then washed again with water.

When the expanded porous PTFE sheet thus washed was immersed in oxygenated water of 60° C. (concentration 30% by weight) for about 20 hours, it was confirmed that the brown color thereof almost fully turned into the original white color. This expanded porous PTFE sheet was taken out of the oxygenated water, washed with water, and thereafter dried.

When the wall faces of perforations were observed with a scanning electron microscope (SEM), it was confirmed that they had a microporous structure consisting of fibrils and nodes which an expanded porous PTFE has inherently. An adhesive cellophane tape defined by JIS Z 1522 was put and compressed onto the expanded porous PTFE sheet, and a 180 degree peel-off test defined by JIS Z 0237 was performed. As a result, it was confirmed that there was no substances adhering to the adhesion cellophane tape and that there were no remains of the degenerative layer generated by etching (i.e., the layer which had discolored to be brown).

EXAMPLE 2

Two expanded porous PTFE sheets having a porosity of 60%, a mean pore diameter of 0.1 μm, and a thickness of 30 μm were laminated as a mask on both faces of a base film consisting of an expanded porous PTFE sheet having a porosity of 60%, a mean pore diameter of 0.1 μm, and a thickness of 0.5 mm. This was put between two stainless boards having a thickness of 3 mm and a heat treatment was performed at 350° C. for 30 minutes. After the heat treatment, rapid cooling was done applying water onto the stainless boards, and thereby a lamination having a melt-bonded three layer structure of "mask layer/base film/mask layer".

A methacrylate resin solution having a concentration of 25% by weight was prepared by dissolving 25 weight parts of methacrylate resin (PMMA, trade name "LG6A", from Sumitomo Chemical Co., Ltd.) in 75 weight parts of acetone at room temperature. The lamination prepared as described above was slowly and carefully immersed in the methacrylate resin solution in a manner such that no air will be left in the porous structure. After confirming that the lamination became semitransparent and that the methacrylate resin solution had fully immersed into the porous structure, it was taken out and dried for about 18 hours at room temperature.

Perforations (through holes) having a diameter of 250 μm were formed at a plurality of positions at a pitch of 500 μm on the lamination by a drill operated under the conditions of turning rate of 100000 r/min and feeding rate of 0.01 mm/rev. After formation of such perforations, the methacrylate resin was removed by dissolving and extracting by means of a Soxhlet extractor using methyl ethyl ketone as a solvent. The wall surfaces of perforations were found to have the microporous structure consisting of fibrils and nodes damaged such that some parts were made nonporous.

When the above-mentioned lamination was immersed for 10 minutes while stirring in a sodium-naphthalene etchant (Trade name: "FluoroEtch," from Acton Technologies, Inc.), the surface discolored from white to brown. The lamination was taken out of the etchant and washed with water, and furthermore it was washed again with water after having been washed with ethanol. Subsequently, when the washed lamination was immersed for about 20 hours in oxygenated water of 60° C. (the concentration: 30% by weight), it was confirmed that the brown color had almost fully returned to the original white. The lamination was removed from the oxygenated water and dried after it had been washed with water. When the wall surfaces of perforations were observed with a scanning electron microscope (SEM), it was confirmed that the microporous structure consisting of fibrils and nodes which an expanded porous PTFE inherently has was maintained over the entire wall surface.

The above-mentioned lamination was immersed for 1 minute in ethanol so as to become hydrophile, and subsequently immersed for 4 minutes at 60° C. in Melplate PC-321 (manufactured by Meltex Inc.) which was diluted at 100 ml/L. Thus, the conditioning was performed. Moreover, the lamination was immersed in 10% sulfuric acid for 1 minute, and thereafter immersed for 2 minutes for pre-dip in a solution which was prepared by dissolving Enplate PC-236 (manufactured by Meltex Inc.) at a rate of 180 g/L into 0.8% hydrochloric acid.

The lamination was immersed for 5 minutes in a solution which was prepared by dissolving Enplate PC-236 (manufactured by Meltex Inc.) at the rate of 150 g/L in a solution prepared by dissolving Enplate Activator 444 (made by Meltex Inc.) by 3%, Enplate Activator Additive by 1%, and hydrochloric acid by 3%, and tin-palladium colloidal particles were adhered to the wall faces of perforations as well as the surface of the lamination. Subsequently, the lamination was immersed in a solution prepared by diluting Enplate PA-360 (made by Meltex Inc.) with pure water at a rate of 50 ml/L, and thereby tin was dissolved such that the catalyst was activated. Thereafter, the mask layers provided on both faces were peeled off so that an expanded porous PTFE sheet (base film) in which catalyst palladium particles were adhered only to the wall faces of perforations was obtained.

The above-mentioned base film was immersed for 20 minutes, while air stirring was sufficiently performed, in an electroless copper plating bath whose initial composition was such that Melplate Cu-3000A, Melplate Cu-3000B, Melplate Cu-3000C, and Melplate Cu-3000D (which were made by Meltex Inc.) were respectively 5% and Melplate Cu-3000 Stabilizer was 0.1%. In this manner, copper particles were deposited to the wall faces of perforations so that they were afforded electrical conductivity. Subsequently, gold plating was performed in order to provide an antirust property and a reduction of contact resistance with respect to contact with a device.

The gold plating was conducted adopting a replacement gold plating method from nickel as follows. A lamination in which copper particles were adhered to the wall faces of perforations was immersed for 3 minutes in Activator Aurotech SIT Additive made by ATOTECH (80 ml/L) for pre-dip, and thereafter the lamination was immersed for 1 minute in a solution having an initial composition of electroless plating bath comprising Aurotech SIT Activator conc made by ATOTECH (125 ml/L) and Activator Aurotech SIT Additive made by ATOTECH (80 ml/L). Moreover, for providing a catalyst, it was immersed for 1 minute in Aurotech SIT Post Dip made by ATOTECH (25 ml/L), and thereby the catalyst was adhered onto copper particles.

Subsequently, the base film was immersed for 5 minutes in an electroless nickel plating bath having an initial composition of electroless plating bath comprising sodium hypophosphite (20 g/L), trisodium citrate (40 g/L), ammonium pentaborate (13 g/L), and nickel sulfate (22 g/L), and thereby copper particles were coated with nickel plating.

Thereafter, the base film was immersed for 5 minutes in a replacement gold plating solution made by Meltex Inc. [Melplate AU-6630A (200 ml/L), Melplate AU-6630B (100 ml/L), Melplate AU-6630C (20 ml/L), and sodium gold sulfite solution (1.0 g/L as gold)], and thereby gold coating was applied to copper particles.

In this way, an anisotropic conductive film was obtained in which an expanded porous PTFE sheet was used as the base film and in which electrical conductivity was afforded only to the wall faces of perforations. This anisotropic conductive film was cut off into a 10 mm square piece and it was measured in respect of a conduction commencement load using the equipment shown in FIG. 4. A copper pillar having a diameter of 2.0 mmφ was used as a probe, and the probe was put in contact with one electrode. Thus, the resistance was measured by the four-terminal method. As a result, the resistance was 0.1Ω at a compressive pressure of 0.06 MPa. Thereafter, it was confirmed that the conduction began at the conduction commencement load pressure of 0.06 MPa even after a load and non-load cycle was repeated 10 times at the load pressure of 3.7 MPa with which the amount of compressive deformation became 100 μm.

COMPARATIVE EXAMPLE 1

Perforations (through holes) were formed in the same expanded porous PTFE sheet as in Example 1 in the same manner as Example 1. When the sheet thus perforated was subjected to etching treatment with a sodium naphthalene etchant as in Example 1, the surface of the sheet discolored from white to brown. The sheet was washed with water, and moreover after washing with ethanol, it was washed again with water, and dried.

When the wall surface of a perforation was observed with a SEM, the microporous structure consisting of fibrils and nodes was found to be damaged such that the microporous structure turned to a nonporous structure in the same manner as in the case prior to the etching treatment. An adhesive cellophane tape was compressively applied so as to stick onto the expanded porous PTFE sheet as in Example 1, and a 180 degree peel-off test was performed. Consequently, it was observed that the brown degenerative layer exfoliated and adhered to the adhesive part of the tape.

COMPARATIVE EXAMPLE 2

An expanded porous PTFE sheet lamination having a three-layer structure of "mask layer/base film/mask layer" was prepared 3 as in Example 2, and perforations (through holes) were formed in the same manner as Example 2. This lamination was subjected to etching treatment as in Example 1, washed after it was taken-out, and then it was washed again with water after having been washed with ethanol, and subsequently it was dried. Thereafter, as in Example 2, catalyst particles were adhered to the wall faces of perforations as well as the surface of the lamination, and then mask layers provided on both faces were peeled off by hand. As in Example 2, copper particles were deposited on the wall surfaces of perforations in the base film, and subsequently gold plating was performed. When an anisotropic conductive film obtained in this way was measured in terms of a resistance value and a conduction commencement load in the same method as in Example 2, it was confirmed that conduction did not occur even at a load of 5.0 MPa.

INDUSTRIAL APPLICABILITY

According to the present invention, a method of manufacturing a porous resin substrate is provided which is made of a resin material containing a fluoropolymer and in which a perforation is formed by machining, laser processing, or the like such that the porous structure of the entire porous resin substrate is maintained and such that a part made nonporous in the wall face of the perforation is made porous. The present invention also provides a method of manufacturing a porous resin substrate in which electrical conductivity is selectively afforded to the wall face of the perforation having such porous structure.

More specifically, if a perforation (through hole) is formed in an expanded porous PTFE substrate by machining or laser processing, for example, the microporous structure of the wall surface of the perforation is damaged such that the microporous structure tends to easily become nonporous. If this is subjected to sodium etching, the shape will not change substantively. However, it is possible to fully remove an etch treated layer by subjecting the etch treated layer to oxidation decomposition with a compound having oxidizability such as hydrogen peroxide or a solution thereof, and to cause the wall face of the perforation to recover the inherent microporous structure of the expanded porous PTFE substrate.

The perforated porous resin substrate obtained by a manufacturing method of the present invention is useful as an insulation substrate for a circuit connection material and an anisotropic conductive material, for example, and moreover it can be used in various fields: a medical treatment device such as a patch restoration material, or a separating membrane, etc.

Also, a porous resin substrate obtained by a manufacturing method of the present invention, in which electrical conductivity is afforded to the wall face of a perforation, can be used, for example, for mutual electrical connection of circuit elements in a semiconductor device; and for an electric reliability inspection performed with respect to a circuit board, a semiconductor wafer, and a semiconductor package.

The invention claimed is:

1. A method of manufacturing a perforated porous resin substrate, the method including the following Steps 1 to 3:
   (1) Step 1 of forming at least one perforation penetrating in the thickness direction from a first surface to a second surface in a porous resin substrate made of a resin material containing a fluoropolymcr by machining or laser processing;
   (2) Step 2 of etching treatment conducted by putting an etchant containing an alkali metal in contact with a wall face of each perforation; and
   (3) Step 3 of putting an oxidizable compound or a solution thereof in contact with a degenerative layer generated by the etching treatment, and thereby removing the degenerative layer, such that in addition to the porous structure of the entire porous structure being maintained, the wall face of the perforation which has been made nonporous is made porous.

2. A manufacturing method as set forth in claim 1, wherein the porous resin substrate is an expanded porous PTFE sheet having a microporous structure consisting of fibrils and nodes connected to one another by the fibrils.

3. A manufacturing method as Set forth in claim 1, wherein in Step 2, the etchant contains an alkali metal and an aromatic compound.

4. A manufacturing method as set forth in claim 1, wherein in Step 3, the oxidizable compound of a solution thereof is hydrogen peroxide, oxygenated water, hypochlorite solution, or chlorite solution.

5. A method of manufacturing a perforated porous resin substrate as set forth in claim 1, wherein the method includes the following processes a to e in Steps 1 to 3:
   (a) Process a of forming a 3-layer lamination by stacking a resin layer as a mask layer on both faces of a porous resin substrate made of a resin material containing a fluoropolymer (Step 1a);
   (b) Process b of forming at least one perforation penetrating in the thickness direction from a first surface to a second surface of the lamination (Step 1b);
   (c) Process c of etching treatment conducted by putting an etchant containing an alkali metal in contact with the wall face of each perforation (Step 2);
   (d) Process d of removing a degenerative layer by putting an oxidizable compound or the solution thereof in contact with the degenerative layer, the degenerative layer having been generated by the etching treatment (Step 3a); and
   (e) Process e of peeling off the mask layers from both faces of the porous resin substrate (Step 3b).

6. A manufacturing method as set forth in any one of claims 1 to 5, wherein a perforation is formed in the porous resin substrate according to the following processes 1-a to 1-d in Step 1:
   (a) Process 1-a of impregnating a liquid or solution to the inside of the porous structure of a porous resin substrate which is made of a resin material containing a fluoropolymer;
   (b) Process 1-b of forming a solid from the liquid or solution this impregnated;
   (c) Process 1-c of forming at least one perforation penetrating the thickness direction from a first surface to a second surface in the porous resin substrate in hick the solid has been formed in the porous structure; and
   (d) Process 1-d of removing the solid from the inside of the porous structure by melting or dissolving the solid.

7. A method of manufacturing a porous resin substrate, wherein the wall face of a perforation in the porous resin substrate is selectively afforded electrical conductivity, the method including the following Steps 1 to 5:
   (1) Step 1 of forming at least one perforation penetrating in the thickness direction from a first surface to a second surface in a porous resin substrate made of a resin material containing a fluoropolymer by machining or laser processing;
   (2) Step 2 of etching treatment conducted by putting an etchant containing an alkali metal in contact with a wall face of each perforation; and
   (3) Step 3 of putting an oxidizable compound or the solution thereof in contact with a degenerative layer generated by the etching treatment, and thereby removing the degenerative layer;

(4) Step 4 of adhering a catalyst for facilitating the reduction reaction of a metal ion to the wall face of each perforation; and
(5) Step 5 of adhering a conductive metal to the wall face of each perforation by means of the catalyst,
such that in addition to the porous structure of the entire porous structure being maintained, the wall face of the perforation which has been made nonporous is made porous.

8. A manufacturing method as set forth in claim 7, wherein a perforation is formed in the porous resin substrate and a catalyst for facilitating the reduction reaction of a metal ion is adhered to the wall face of the perforation by the following processes A to F in Steps 1 to 4:
   (A) Process A of forming a three layered lamination by laminating a resin layer as a mask layer onto both faces of a porous resin substrate made of a resin material containing a fluoropolymer (Step 1A);
   (B) Process B of forming at least one perforation penetrating in the thickness direction from a first surface to a second surface in the lamination (Step 1B);
   (C) Process C of etching treatment conducted by putting an etchant containing an alkali metal in contact with the wall face of a perforation (Step 2);
   (D) Process D of putting an oxidizable compound or the solution thereof in contact with a degenerative layer generated by the etching treatment, and thereby removing the degenerative layer (Step 3);
   (E) Process E of adhering a catalyst for facilitating the reduction reaction of a metal ion to the surface of the lamination including the wall face of each perforation; and
   (F) Process F of peeling off the mask layers from both faces of the porous resin substrate (Step 4B).

9. A manufacturing method as set forth in claim 7, wherein a perforation is formed in a porous resin substrate and a catalyst for facilitating the reduction reaction of a metal ion is adhered to the wall face of the perforation by the following processes (i) to (ix) in Steps 1 to 4:
   (i) Process i of forming a three layered lamination by laminating a resin layer as a mask layer onto both faces of a porous resin substrate made of a resin material containing a fluoropolymer (Step 1-A);
   (ii) Process ii of impregnating the inside of the porous structure of the lamination with a soluble polymer, or a paraffin or a compound which can form a solid by chemical reaction (Step 1-B);
   (iii) Process iii of forming a solid from a soluble polymer, the paraffin, or the compound which can form a solid by chemical reaction (Step 1-C);
   (iv) Process iv of forming at least one perforation penetrating in the thickness direction from a first surface to a second surface in the lamination having a porous structure in which the solid is formed (Step 1-D);
   (v) Process v of removing the solid from the inside of the porous structure by dissolving the solid (Step 1-E);
   (vi) Process vi of etching treatment conducted by putting an etchant containing an alkali metal in contact with the wall face of a perforation (Step 2);
   (vii) Process vii of putting an oxidizable compound or the solution thereof in contact with a degenerative layer generated by the etching treatment, and thereby removing the degenerative layer (Step 3);
   (viii) Process viii of adhering a catalyst for facilitating the reduction reaction of a metal ion to the surface of the lamination including the wall face of each perforation; (Step 4-A); and
   (ix) Process ix of peeling off the mask layers from both faces of the porous resin substrate (Step 4B).

10. A manufacturing method as set forth in claim 7, wherein a perforation is formed in the porous resin substrate and subsequently a catalyst for facilitating the reduction reaction of a metal ion is adhered to the wall face of the perforation by the following processes I to VII in Steps 1 to 4:
    (I) Process I of adhering a soluble polymer, or paraffin or a compound capable of forming a solid by chemical reaction to, and impregnating the same into, the porous structure as well as both faces of the porous resin substrate made of a resin material containing a fluoropolymer (Step 1-I);
    (II) Process II of forming a compound sheet in which a solid form is made from the adhered and impregnated soluble polymer, paraffin or compound capable of forming a solid by chemical reaction such that a solid layer is formed on both faces of the porous resin substrate and the solid is impregnated into the porous structure (Step 1-II);
    (III) Process III of forming at least one perforation penetrating in the thickness direction from a first surface to a second surface in the compound sheet (Step 1-III);
    (IV) Process IV of etching treatment conducted by putting an etchant containing an alkali metal in contact with the wall face of each perforation (Step 2);
    (V) Process V of putting an oxidizable compound or the solution thereof in contact with a degenerative layer generated by the etching treatment, and thereby removing the degenerative layer (Step 3);
    (VI) Process VI of adhering a catalyst for facilitating the reduction reaction of a metal ion to the surface of the compound sheet including the wall face of a perforation (Step 4-I); and
    (VII) Process VII of removing the solid from the compound sheet (Step 4-II).

11. A manufacturing method as set forth in claim 7, wherein in Step 5, a conductive material is adhered to the wall face of each perforation by means of an electroless plating method.

12. A manufacturing method as set forth in any one of claims 7 to 11, wherein in Step 1, an expanded porous polytetrafluoroethylene sheet having a microporous structure consisting of fibrils and nodes connected with one another by the fibrils is used as the porous resin substrate formed of a resin material containing a fluoropolymer, and wherein the porous resin substrate in which electrical conductivity is afforded to the wall face of a perforation is an anisotropic conductive film obtained in Steps 1 to 5, the conductive film having a conductive part formed by conductive metal adhered to the resin part of the microporous structure of the wall face of the perforation and the conductive part being capable of affording conductivity only in a film thickness direction.

* * * * *

UNITED STATES PATENT AND TRADEMARK OFFICE
CERTIFICATE OF CORRECTION

| | |
|---|---|
| PATENT NO. | : 7,807,066 B2 |
| APPLICATION NO. | : 11/660993 |
| DATED | : October 5, 2010 |
| INVENTOR(S) | : Mayo Uenoyama et al. |

It is certified that error appears in the above-identified patent and that said Letters Patent is hereby corrected as shown below:

Title page, item (87), PCT Pub Date reads: Feb. 3, 2006 but it should read March 2, 2006 and

Col. 22, claim 6, line 48 reads: surface in the porous resin substrate in hick the solid; it should read surface in the porous resin substrate in which the solid...

Signed and Sealed this

Twenty-fifth Day of January, 2011

David J. Kappos
*Director of the United States Patent and Trademark Office*